(12) United States Patent
Park

(10) Patent No.: US 12,154,925 B2
(45) Date of Patent: Nov. 26, 2024

(54) IMAGE SENSING DEVICE

(71) Applicant: SK hynix Inc., Icheon-si (KR)

(72) Inventor: Soon Yeol Park, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 213 days.

(21) Appl. No.: 17/196,866

(22) Filed: Mar. 9, 2021

(65) Prior Publication Data

US 2021/0384232 A1  Dec. 9, 2021

(30) Foreign Application Priority Data

Jun. 4, 2020 (KR) ........................ 10-2020-0067540

(51) Int. Cl.
H01L 27/146 (2006.01)

(52) U.S. Cl.
CPC ...... H01L 27/1463 (2013.01); H01L 27/1462 (2013.01); H01L 27/14636 (2013.01)

(58) Field of Classification Search
CPC ............. H01L 27/1463; H01L 27/1462; H01L 27/14636
See application file for complete search history.

(56) References Cited

U.S. PATENT DOCUMENTS

| 2016/0027821 A1 | 1/2016 | Ahn et al. |
| 2019/0148448 A1 | 5/2019 | Lee |
| 2020/0077055 A1 | 3/2020 | Kim et al. |
| 2020/0279877 A1* | 9/2020 | Kim ................. H01L 27/14614 |

FOREIGN PATENT DOCUMENTS

| CN | 101752397 A | 6/2010 |
| CN | 103972258 A | 8/2014 |
| CN | 106960853 A | 7/2017 |
| CN | 110299371 A | 10/2019 |
| KR | 10-0670606 B1 | 1/2007 |
| KR | 10-2015-0012574 A | 2/2015 |
| KR | 10-0630689 B | 10/2016 |
| KR | 10-2018-0081203 A | 7/2018 |

OTHER PUBLICATIONS

Request for the Submission of an Opinion for KR Appl. No. 10-2020-0067540, mailed on Jul. 21, 2024, 13 pages with English translation.

* cited by examiner

*Primary Examiner* — Jay C Kim
*Assistant Examiner* — Woo K Lee
(74) *Attorney, Agent, or Firm* — Perkins Coie LLP

(57) ABSTRACT

An image sensing device includes a substrate, a plurality of unit image sensing pixels supported by the substrate and structured to respond to incident light to generate an electrical signal corresponding to the incident light, and one or more device isolation regions supported by the substrate and arranged between adjacent unit image sensing pixels to isolate the plurality of unit image sensing pixels from each other. The device isolation region includes a first conductive layer, a second conductive layer spaced apart from the first conductive layer, and a first insulation layer disposed between the first conductive layer and the second conductive layer.

11 Claims, 17 Drawing Sheets

IMAGE SENSING DEVICE

CROSS-REFERENCE TO RELATED APPLICATION

This patent document claims the priority and benefits of Korean patent application No. 10-2020-0067540, filed on Jun. 4, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to an image sensing device for increasing capacitance of a floating diffusion region while less affecting a pixel region.

In an embodiment of the disclosed technology, an image sensing device may include a substrate, a plurality of unit image sensing pixels supported by the substrate and structured to respond to incident light to generate an electrical signal corresponding to the incident light, and a one or more device isolation regions supported by the substrate and arranged between adjacent unit image sensing pixels to isolate the plurality of unit image sensing pixels from each other. The device isolation region may include a first conductive layer, a second conductive layer spaced apart from the first conductive layer, and a first insulation layer disposed between the first conductive layer and the second conductive layer.

In another embodiment of the disclosed technology, an image sensing device may include a plurality of unit image sensing pixel groups consecutively arranged in a first direction and a second direction perpendicular to the first direction, and one or more device isolation regions arranged between adjacent unit image sensing pixel group to isolate the plurality of unit image sensing pixel groups from each other. Each of the unit image sensing pixel groups may include a plurality of unit image sensing pixels structured to respond to incident light to generate an electrical signal corresponding to the incident light. The device isolation region may include a first conductive layer, a second conductive layer spaced apart from the first conductive layer, and a first insulation layer disposed between the first conductive layer and the second conductive layer.

In another embodiment of the disclosed technology, an image sensing device may include a plurality of unit pixels configured to generate an electrical signal corresponding to incident light by performing photoelectric conversion of the incident light, and a device isolation region configured to isolate the plurality of unit pixels from each other. The device isolation region may include a lower conductive layer, a first insulation layer disposed over the lower conductive layer, and an upper conductive layer disposed over the first insulation layer.

In another embodiment of the disclosed technology, an image sensing device may include a plurality of unit pixel groups consecutively arranged in a first direction and a second direction perpendicular to the first direction, and a device isolation region configured to isolate the plurality of unit pixel groups from each other. Each of the unit pixel groups may include a plurality of unit pixels configured to generate an electrical signal corresponding to incident light by performing photoelectric conversion of the incident light. The device isolation region may include a lower conductive layer, a first insulation layer disposed over the lower conductive layer, and an upper conductive layer disposed over the first insulation layer.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device and the disclosed features may be implemented to substantially address one or more issues due to limitations and disadvantages of various image sensing devices. Some implementations of the disclosed technology suggest designs of an image sensing device which can increase capacitance of a floating diffusion region while less affecting a pixel region.

Figure 1:
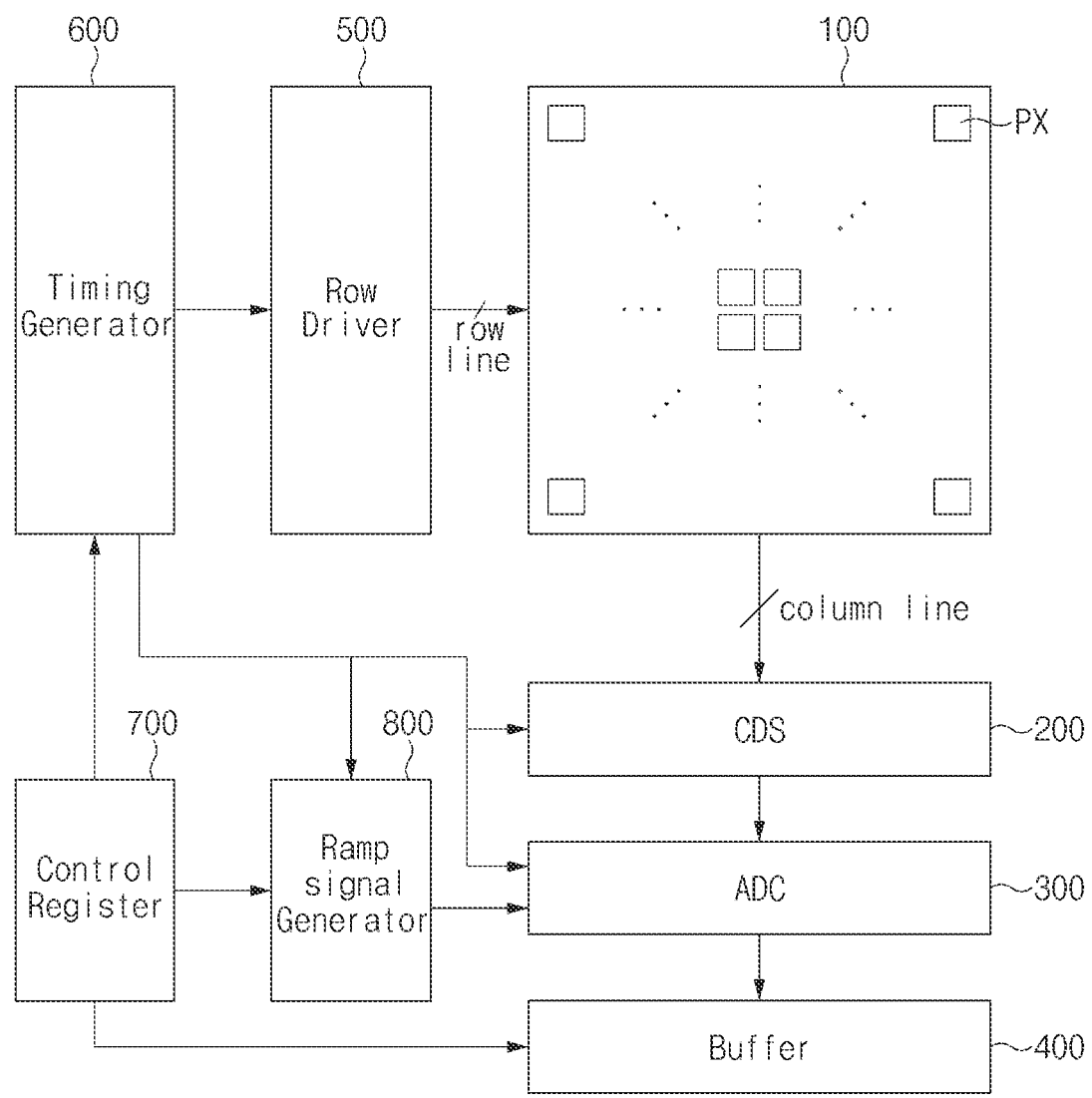
FIG. 1 is a block diagram illustrating an example layout of an image sensing device based on some implementations of the disclosed technology.

FIG. 1 is a block diagram illustrating an example of an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800. The components of the image sensing device 100 illustrated in FIG. 1 are discussed by way of example only, and this patent document encompasses numerous other changes, substitutions, variations, alterations, and modifications.

The pixel array 100 may include a plurality of unit image sensing pixels PXs (hereinafter referred to as "unit pixel") arranged in rows and columns. In one example, the plurality of unit pixels can be arranged in a two dimensional pixel array including rows and columns. In another example, the plurality of unit pixels can be arranged in a three dimensional pixel array. Each unit pixel PX may generate a pixel signal corresponding to incident light by converting light into an electrical current. The pixel array 100 may receive driving signals, including a row selection signal, a pixel reset signal and a transmission signal, from the row driver 500. Upon receiving the driving signal, corresponding unit pixels in the pixel array 100 may be activated to perform the operations corresponding to the row selection signal, the pixel reset signal, and the transmission signal. The pixel array 100 may output the pixel signal to the correlated double sampler (CDS) 200 through column lines. Each unit pixel PX may include a photoelectric conversion element structured to generate photocharges by converting incident light, a floating diffusion region structured to temporarily store the photocharges generated by the photoelectric conversion element, and a transfer transistor structured to transmit the photocharges generated by the photoelectric conversion element to the floating diffusion region based on a transmission signal. The unit pixels PXs may be isolated from each other by a device isolation region. In this case, the device isolation region may include a dual conversion gain (DCG) capacitor to adjust capacitance of the floating diffusion region. A detailed description of the DCG capacitor will be given at a later time.

As discussed above, each unit pixel PX may output the pixel signal to the correlated double sampler (CDS) 200. CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 200 may sequentially sample and hold voltage levels of the reference signal and the image signal, which are provided to each of a plurality of column lines from the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 may be used to convert analog CDS signals to digital signals. In some implementations, the ADC 300 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 300 may convert the correlate double sampling signal generated by the CDS 200 for each of the columns into a digital signal, and output the digital signal. The ADC 300 may perform a counting operation and a computing operation based on the correlate double sampling signal for each of the columns and a ramp signal received from the ramp signal generator 800. In this way, the ADC 300 may eliminate or reduce noises such as reset noise arising from the imaging pixels when generating digital image data.

The ADC 300 may include a plurality of column counters. Each column of the pixel array 100 is coupled to a column counter, and image data can be generated by converting the correlate double sampling signals received from each column into digital signals using the column counter. In another embodiment of the disclosed technology, the ADC 300 may include a global counter to convert the correlate double sampling signals corresponding to the columns into digital signals using a global code provided from the global counter.

The buffer 400 may temporarily hold or latch each of the digital signals received from the analog-to-digital converter (ADC) 300, may sense or detect and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels PXs. The sense amplifier may sense and amplify each count value received from the memory.

The row driver 500 may be used to drive the pixel array 100 in response to an output signal of the timing generator 600. In some implementations, the row driver 500 may select one or more imaging pixels arranged in one or more rows of the pixel array 100. The row driver 500 may generate a row selection signal to select one or more rows among the plurality of rows. The row decoder 500 may sequentially enable the pixel reset signal for resetting imaging pixels corresponding to at least one selected row, and the transmission signal for the pixels corresponding to the at least one selected row.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal in response to a control signal of the control register 700 and a timing signal received from the timing generator 600, and may output the ramp signal to the analog-to-digital converter (ADC) 300.

Figure 2:
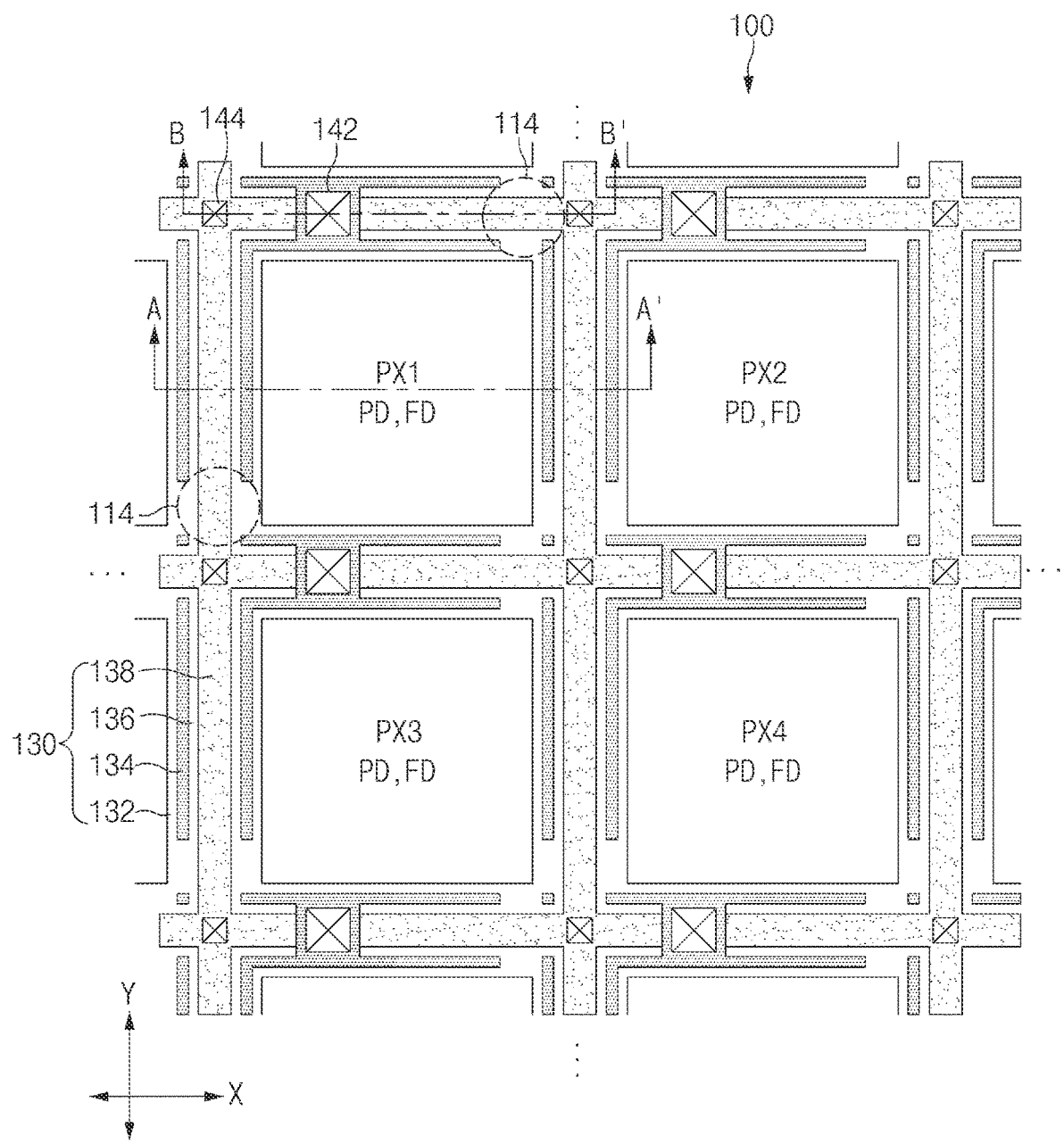
FIG. 2 is a plan view illustrating an example of a planar arrangement of a dual conversion gain (DCG) capacitor based on some implementations of the disclosed technology.
Figure 3A:
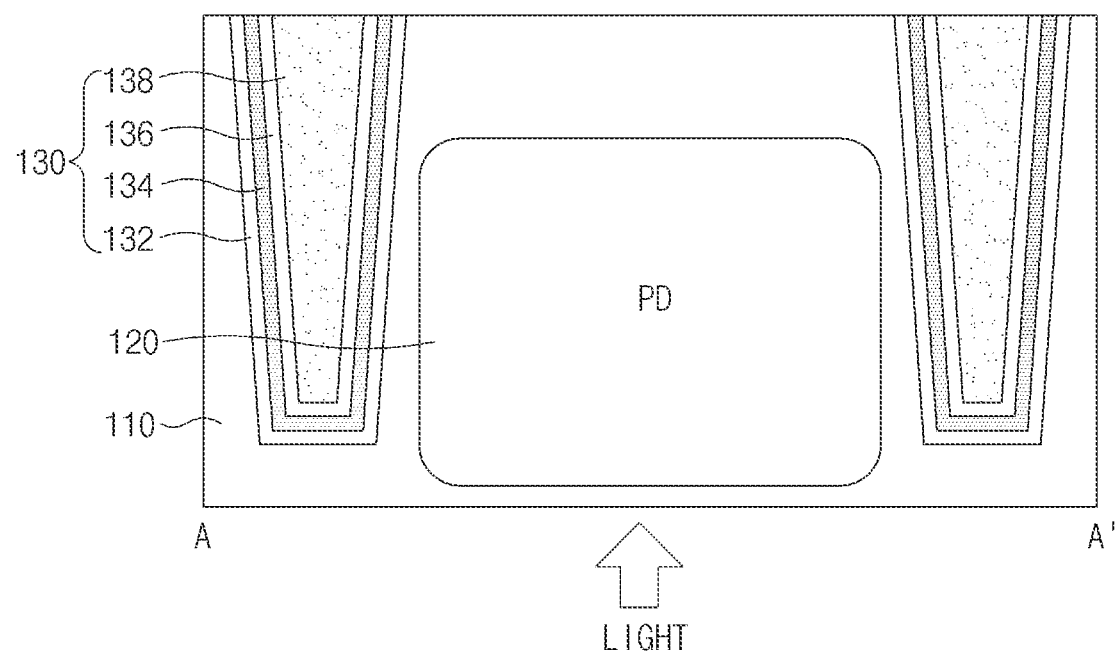
FIG. 3A is a cross-sectional view illustrating an example of the image sensing device taken along the line A-A' shown in FIG. 2 based on some implementations of the disclosed technology.
Figure 3B:
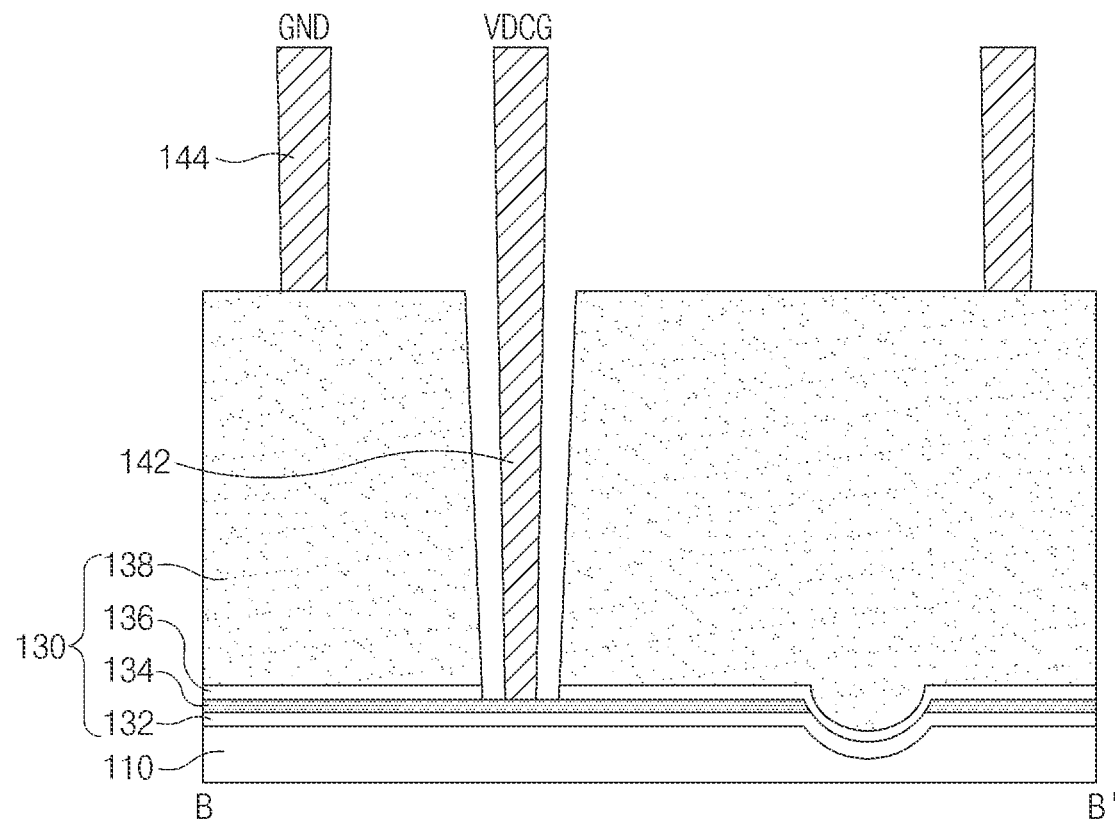
FIG. 3B is a cross-sectional view illustrating an example of the image sensing device taken along the line B-B' shown in FIG. 2 based on some implementations of the disclosed technology.

FIG. 2 is a plan view illustrating an example of a planar arrangement of a dual conversion gain (DCG) capacitor based on some implementations of the disclosed technology. FIG. 3A is a cross-sectional view illustrating an example of the image sensing device taken along the line A-A' shown in FIG. 2. FIG. 3B is a cross-sectional view illustrating an example of the image sensing device taken along the line B-B' shown in FIG. 2.

Referring to FIGS. 2, 3A and 3B, the pixel array 100 may include a plurality of unit pixels PX1-PX4 consecutively arranged in an X-axis direction and a Y-axis direction. Each of the unit pixels PX1-PX4 may include a photoelectric conversion element (PD) 120 to generate photocharges through photoelectric conversion of incident light, and a floating diffusion region FD to hold or temporarily store photocharges generated by the photoelectric conversion element (PD) 120.

The photoelectric conversion element 120 may be disposed in a substrate 110 of each of the unit pixels PX1-PX4. The floating diffusion region FD may be formed at an upper portion of the photoelectric conversion element 120 in the substrate 110. For example, the substrate 110 may include a first surface upon which light is incident, and a second surface facing or opposite to the first surface. The photoelectric conversion element 120 may be formed in the substrate 110 to be adjacent to the first surface. The floating diffusion region FD may be formed in an upper portion of the substrate 110 to be in contact with the second surface of the substrate 110. In addition, pixel transistors for outputting electrical signals generated by the unit pixels PX1-PX4 through column lines may be formed over the second surface of the substrate 110.

The unit pixels PX1-PX4 may be physically isolated from adjacent unit pixels by a device isolation region 130. The device isolation region 130 may include an isolation structure that is formed by filling a trench with an electrically insulating material. In one example, the device isolation region 130 may be formed in a deep trench isolation (DTI) structure. In this case, the isolation structure may be formed by etching the substrate to a predetermined depth and filling the etched region with an electrically insulating material. Specifically, the device isolation region 130 may include a dual conversion gain (DCG) capacitor formed in the trench. In some implementations of the disclosed technology, the device isolation region 130 may include multilayer structure that includes one or more conductive layers and one or more electrically insulating material layers. In some implementations, the device isolation region 130 may include a first conductive layer (e.g., 134), a second conductive layer (e.g., 138) spaced apart from the first conductive layer, and a first insulation layer (e.g., 136) disposed between the first and second conductive layers. For example, the device isolation region 130 may include an insulation layer 132, the first conductive layer 134 formed over the insulation layer 132, an insulation layer 136 formed over the first conductive layer 134, and the second conductive layer 138 formed over the insulation layer 136. In this case, the dual conversion gain (DCG) capacitor may include the first conductive layer 134, the insulation layer 136, and the second conductive layer 138. The insulation layer 132 may be used as a field effect passivation (FEP) layer to prevent a field effect. Each of the insulation layers 132 and 136 may include at least one of silicon oxide ($SiO_2$), aluminum oxide ($Al_2O_3$), and hafnium oxide (HfO). Each of the first conductive layer 134 and the second conductive layer 138 may include at least one of titanium (Ti), cobalt (Co), copper (Cu), aluminum (Al), and polysilicon.

The first conductive layers 134 may be separate and isolated from each other. In some implementations, each first conductive layer 134 is corresponding to each of the unit pixels PX1-PX4 on a one to one basis. That is, in some implementations, there is a one-to-one correspondence between the first conductive layers 134 and the unit pixels PX1-PX4. Each first conductive layer 134 may be formed over some of side or lateral surfaces of the corresponding unit pixel PX1, PX2, PX3, or PX4, and may be electrically isolated from the first conductive layer corresponding to another adjacent unit pixel. For example, as shown in FIG. 2, each first conductive layer 134 may be formed in an "L"-shaped structure only at two side or lateral surfaces (e.g., an upper side surface and a left side surface) from among four side or lateral surfaces of the corresponding unit pixel PX1, PX2, PX3, or PX4. Alternatively, each first conductive layer 134 may be formed in another "L"-shaped structure only at upper and right side surfaces of the corresponding unit pixel PX1, PX2, PX3, or PX4. Each first conductive layer 134 may also be formed in in another "L"-shaped structure only at lower and left side surfaces of the corresponding unit pixel PX1, PX2, PX3, or PX4, or may be formed in another "L"-shaped structure only at lower and right side surfaces of the corresponding unit pixel PX1, PX2, PX3, or PX4. In this case, the length of a region extending in an X-axis direction of the first conductive layer 134 and the length of a region extending in a Y-axis direction of the first conductive layer 134 can vary depending on various implementations. In some implementations, the first conductive layer 134 may be separate and isolated from each other. In this patent document, a first-conductive-layer isolation region 114 indicates a region by which the first conductive layers 134 for each unit pixel are electrically isolated from each other.

The first conductive layers 134 may be coupled to one or more contacts 142. In this patent document, the term "contact" can be used to indicate a via or any form of interconnect between layer, such as a via connecting a lower conductive or metal layer to an upper conductive or metal layer. For example, the contact 142 may be coupled, through a conductive interconnect or metal line, to a DCG voltage node VDCG to which a voltage that is higher than a ground voltage is applied.

In the device isolation region 130, the second conductive layers 138 may be coupled to each other in the remaining region other than the region where the contact 142 is formed. For example, the second conductive layer 138 may be formed as a lattice shape surrounding the unit pixels PX1-PX4 and includes a plurality of portions spaced apart from each other at a region which is partially cut due to presence of the region where the contact 142 is formed.

The second conductive layer 138 may be coupled to one or more contacts 144. For example, the contact 144 may be coupled to a ground node GND. Although FIG. 2 illustrates that the contact 144 is formed at every intersection of the second conductive layers 138, the arrangement and number of the contacts 144 may vary depending on various embodiments of the disclosed technology.

The dual conversion gain (DCG) capacitor may be connected to the floating diffusion region FD through the contact 142 or 144. Alternatively, the dual conversion gain (DCG) capacitor may be coupled to a DCG control transistor through the contact 142 or 144. For example, when the DCG control transistor is turned on, the dual conversion gain (DCG) capacitor may be electrically connected to the floating diffusion region FD. When the DCG control transistor is turned off, the dual conversion gain (DCG) capacitor may be electrically disconnected from the floating diffusion region FD.

In some implementations, the device isolation region may include a first conductive layer, a second conductive layer spaced apart from the first conductive layer, and a first insulation layer disposed between the first and second conductive layers. The device isolation region includes a vertical multilayer structure including the first conductive layer, the first insulation layer, and the second conductive layer extending vertically. The device isolation region may further include a second insulation layer disposed between the first conductive layer and the adjacent unit image sensing pixels.

In some implementations, the device isolation region may further include a horizontal multilayer structure that includes the first conductive layer, the first insulation layer, and the second conductive layer extending horizontally. In some implementations, a horizontal multilayer structure of a device isolation region is spaced apart from an adjacent horizontal multilayer structure of an adjacent device isolation region by a recessed region formed between the horizontal multilayer structures.

FIGS. 4A, 5A, 6A, 7A, 8A, and 9A are cross-sectional views illustrating examples of methods for forming the structure shown in FIG. 3A based on some implementations of the disclosed technology. FIGS. 4B, 5B, 6B, 7B, 8B, and 9B are cross-sectional views illustrating examples of methods for forming the structure shown in FIG. 3B based on some implementations of the disclosed technology.

Figure 4A:
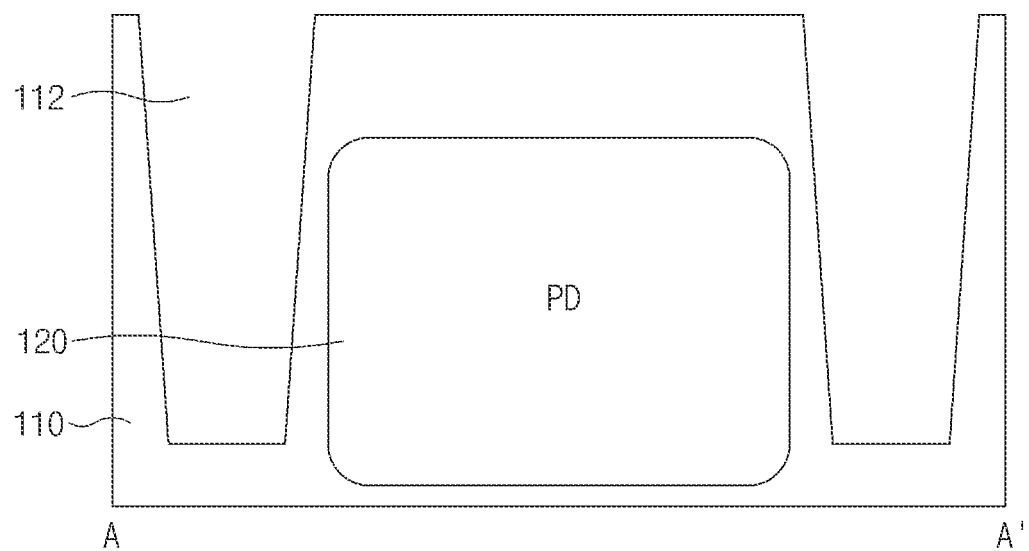
FIG. 4A is a cross-sectional view illustrating forming the structure shown in FIG. 3A based on some implementations of the disclosed technology.
Figure 4B:
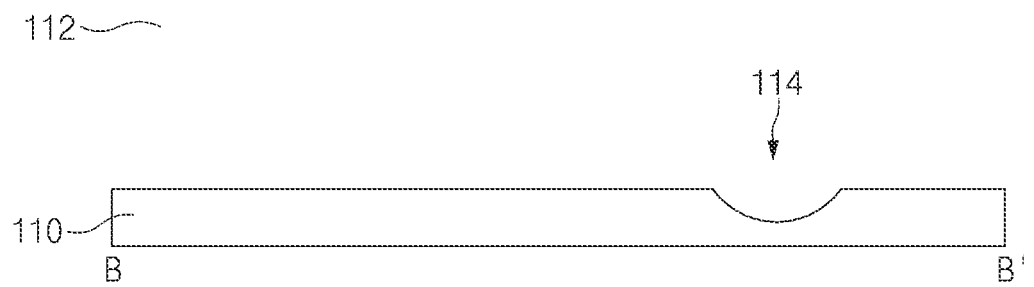
FIG. 4B is a cross-sectional view illustrating forming the structure shown in FIG. 3B based on some implementations of the disclosed technology.

Referring to FIGS. 4A and 4B, after the photoelectric conversion element 120 is formed in the substrate 110, a region corresponding to the device isolation region 130 in the substrate 110 may be etched to a predetermined depth, resulting in formation of a trench 112 for device isolation.

At this time, a recessed region (i.e., the first-conductive-layer isolation region 114) by which the first conductive layers are to be isolated from each other in a subsequent process may be formed by adjusting the etch depth. For example, a portion of the bottom surface of the trench 112 is etched deeper than the other bottom surface of the trench 112.

Figure 5A:
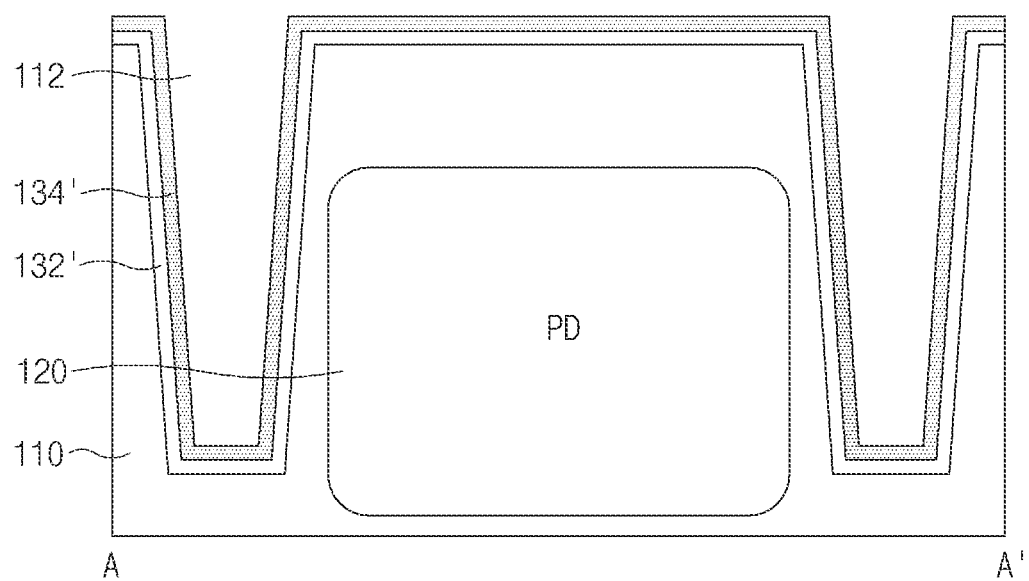
FIG. 5A is another cross-sectional view illustrating forming the structure shown in FIG. 3A based on some implementations of the disclosed technology.
Figure 5B:
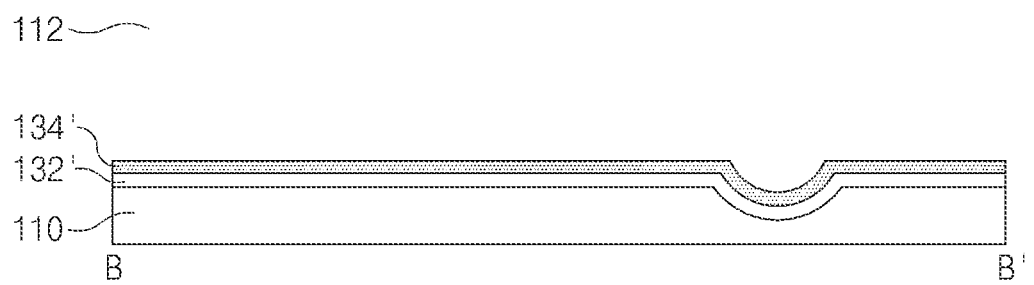
FIG. 5B is another cross-sectional view illustrating forming the structure shown in FIG. 3B based on some implementations of the disclosed technology.

Referring to FIGS. 5A and 5B, an insulation layer 132' and a first conductive layer 134' may be sequentially formed over inner surfaces of the trench 112, and may also be sequentially formed over a region (i.e., a unit pixel region) to be used to form the unit pixel.

Figure 6A:
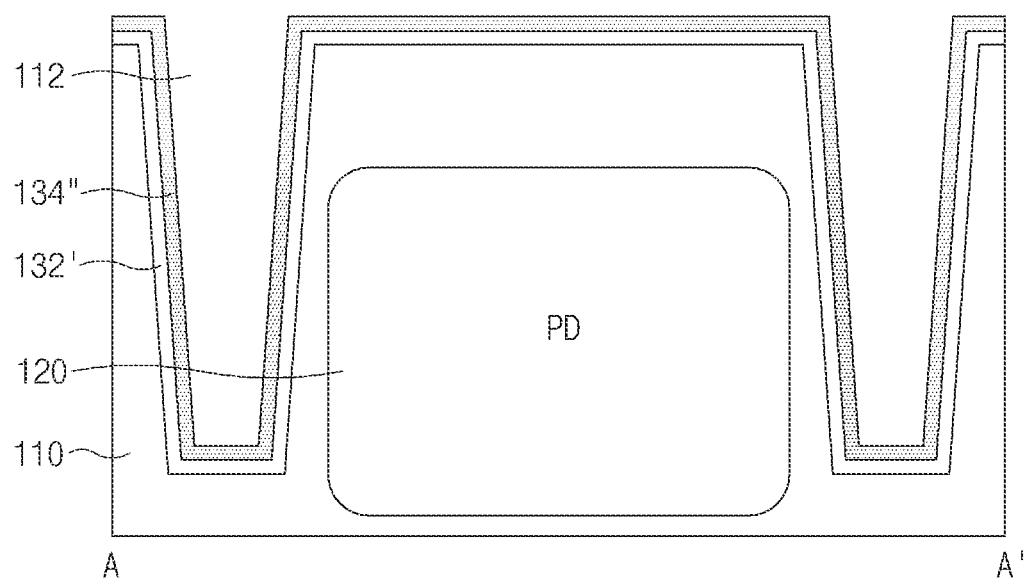
FIG. 6A is another cross-sectional view illustrating forming the structure shown in FIG. 3A based on some implementations of the disclosed technology.
Figure 6B:
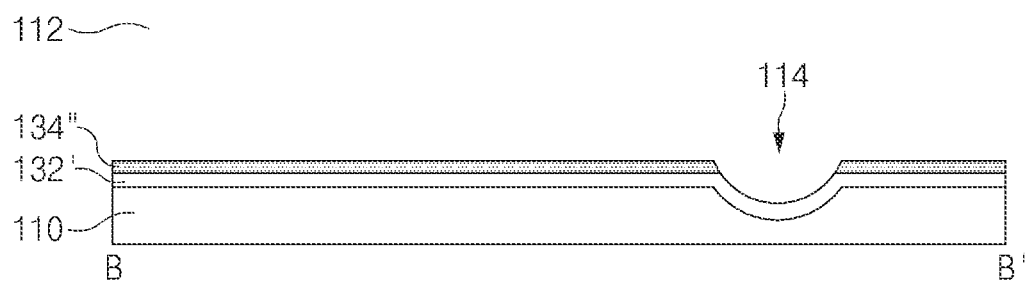
FIG. 6B is another cross-sectional view illustrating forming the structure shown in FIG. 3B based on some implementations of the disclosed technology.

Referring to FIGS. 6A and 6B, the first conductive layer 134' formed in the first-conductive-layer isolation region 114 may be selectively etched or removed.

For example, after a mask pattern (not shown) exposing the first-conductive-layer isolation region 114 is formed over the first conductive layer 134', an etching process may be carried out using the mask pattern as an etch mask. Through the above-mentioned etching process, the first conductive layer 134' may be partially etched or removed from the first-conductive-layer isolation region 114, resulting in formation of a first conductive layer 134".

Figure 7A:
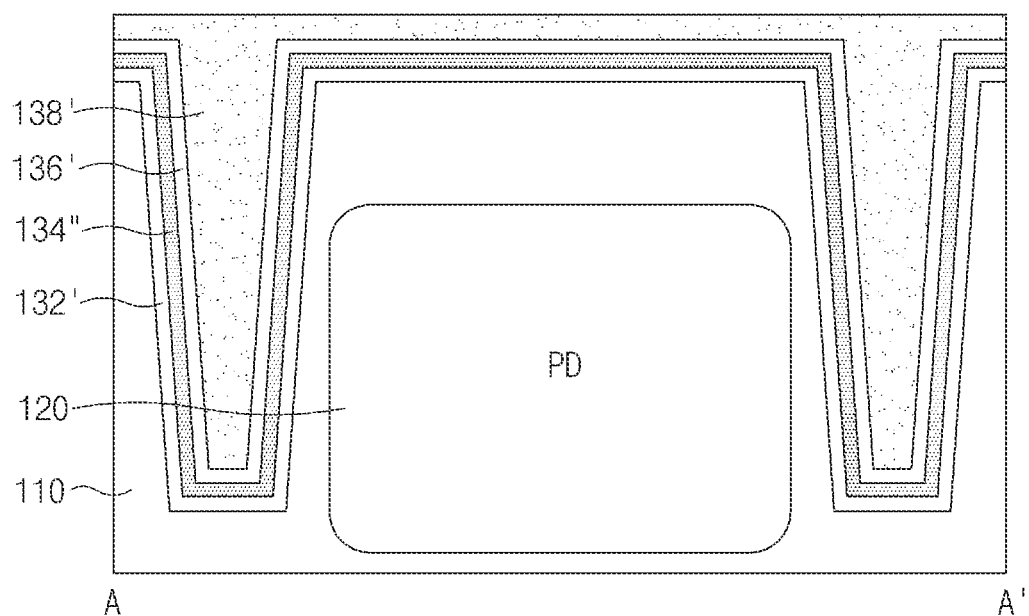
FIG. 7A is another cross-sectional view illustrating forming the structure shown in FIG. 3A based on some implementations of the disclosed technology.
Figure 7B:
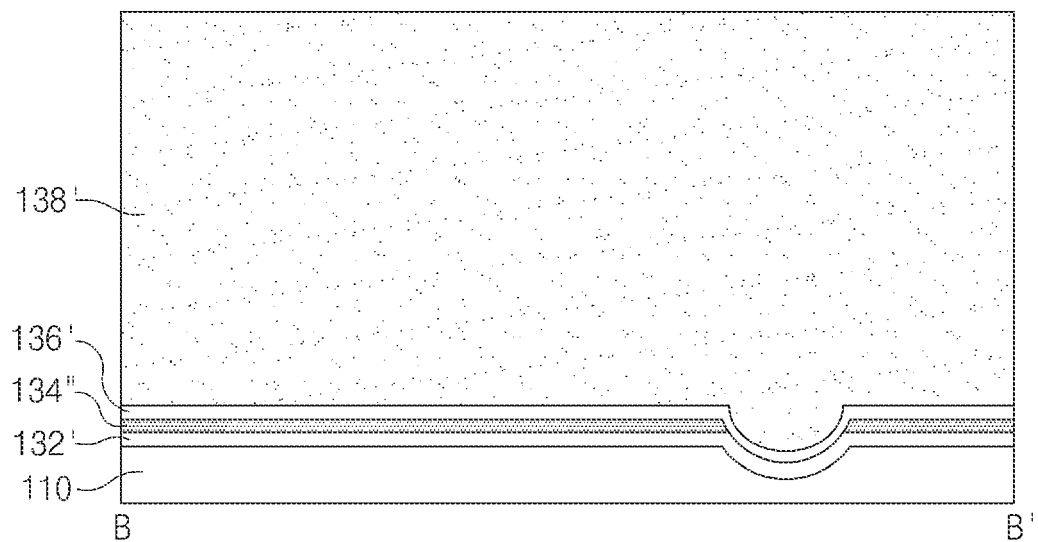
FIG. 7B is another cross-sectional view illustrating forming the structure shown in FIG. 3B based on some implementations of the disclosed technology.

Referring to FIGS. 7A and 7B, an insulation layer 136' may be formed over the first conductive layer 134", and may also be formed over the insulation layer 132' of the first-conductive-layer isolation region 114.

Subsequently, a second conductive layer 138' may be formed over the insulation layer 136' to fill the trench 112.

Figure 8A:
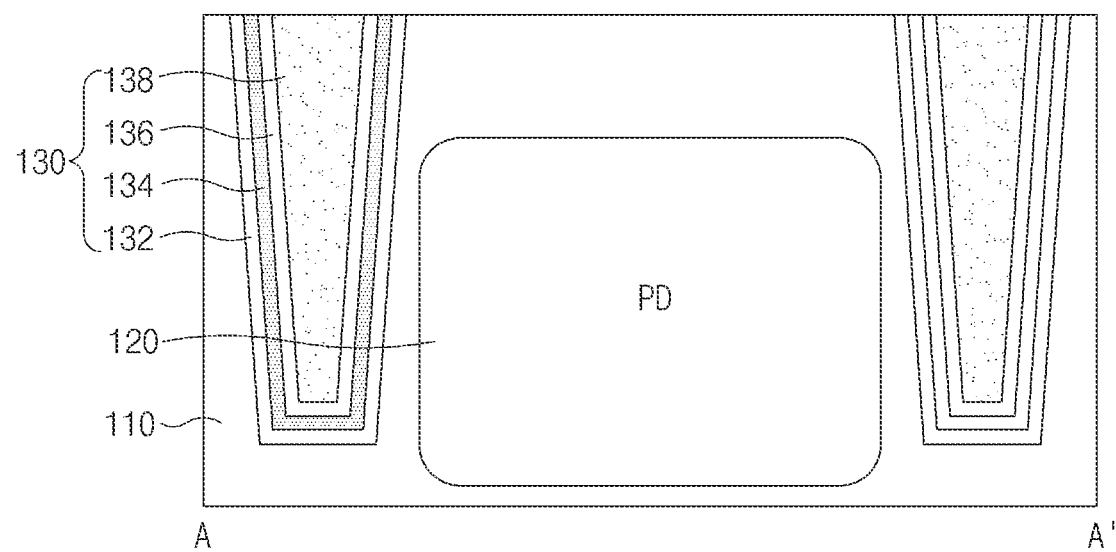
FIG. 8A is another cross-sectional view illustrating forming the structure shown in FIG. 3A based on some implementations of the disclosed technology.
Figure 8B:
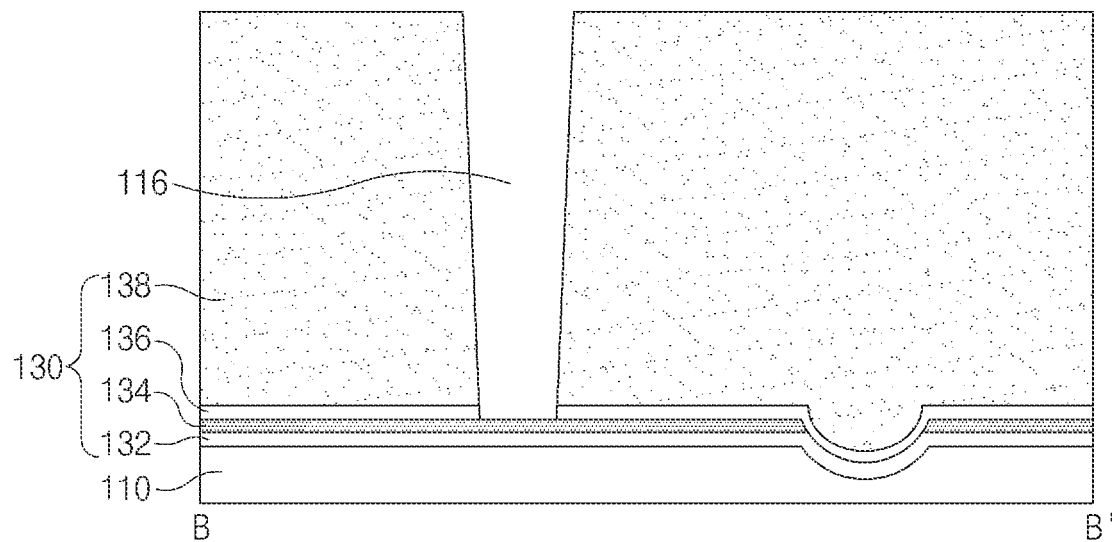
FIG. 8B is another cross-sectional view illustrating forming the structure shown in FIG. 3B based on some implementations of the disclosed technology.

Referring to FIGS. 8A and 8B, the insulation layer 132', the first conductive layer 134", the insulation layer 136', and the second conductive layer 138' formed over the substrate 110 of the unit pixel region can be selectively etched or removed.

For example, a planarization process may be performed until the substrate 110 of the unit pixel region is exposed, such that the insulation layer 132', the first conductive layer 134", the insulation layer 136', and the second conductive layer 138' formed in the unit pixel region can be etched or removed. In this case, the planarization process may include a chemical mechanical polishing (CMP) process.

Subsequently, in the device isolation region 130, the second conductive layer 138' and the insulation layer 136' may be sequentially etched from a region to be used to form the contact 142, resulting in formation of a contact hole 116 exposing the first conductive layer 134.

Figure 9A:
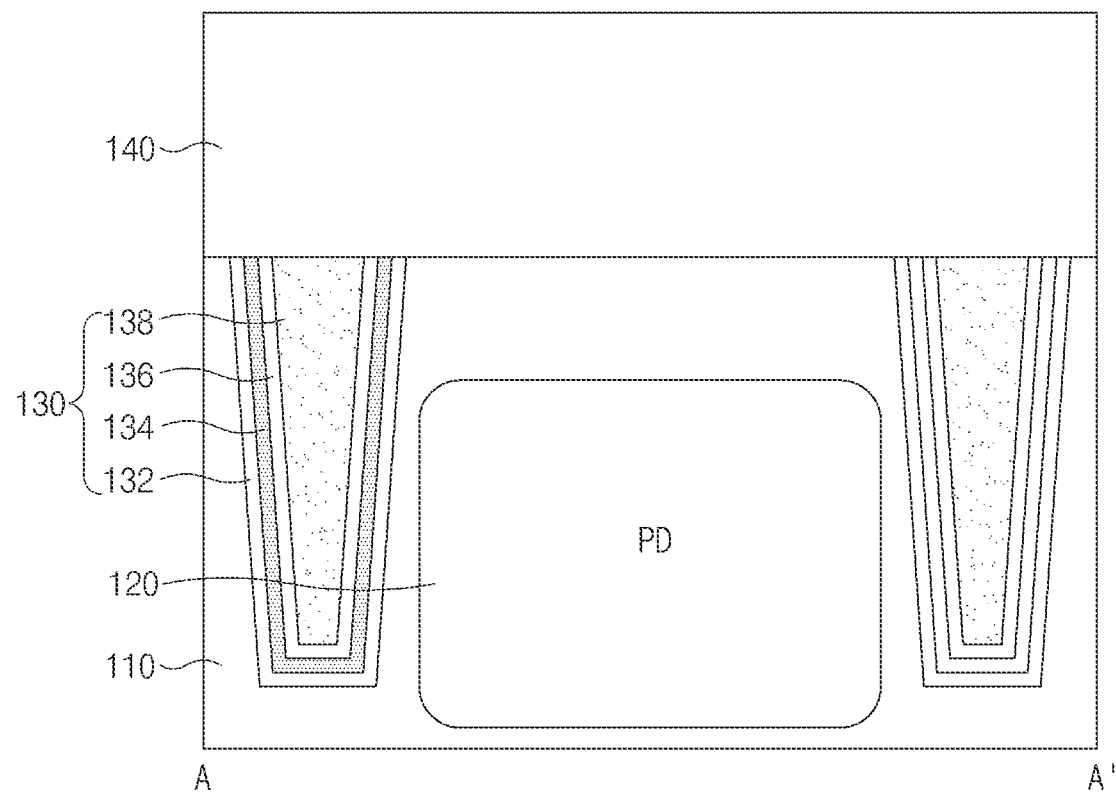
FIG. 9A is another cross-sectional view illustrating forming the structure shown in FIG. 3A based on some implementations of the disclosed technology.
Figure 9B:
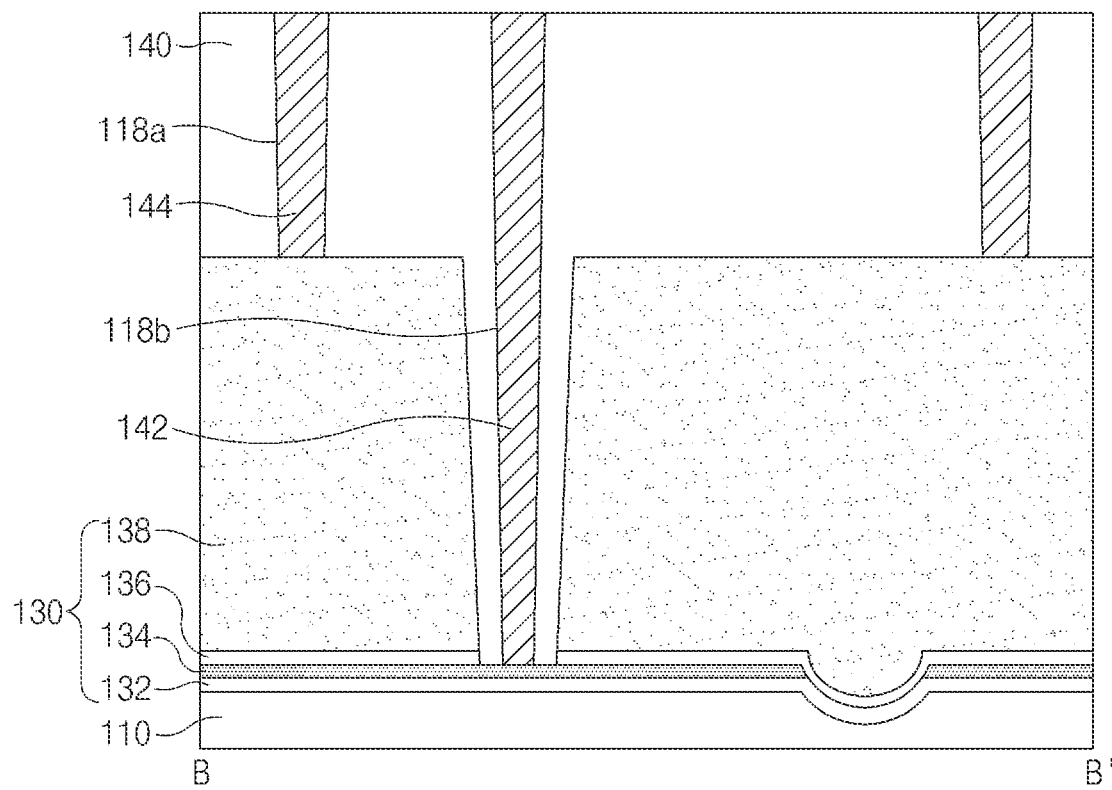
FIG. 9B is another cross-sectional view illustrating forming the structure shown in FIG. 3B based on some implementations of the disclosed technology.

Referring to FIGS. 9A and 9B, the contact 142 coupled to the first conductive layer 134 and the contact 144 coupled to the second conductive layer 138 may be formed.

For example, the insulation layer 140 may be formed over the unit pixel region and the device isolation region 130 to fill the contact hole 116. Subsequently, the insulation layer 140 of the region where the contacts 142 and 144 are to be formed may be etched to form contact holes 118a and 118b, and the contact holes 118a and 118b may be filled with conductive materials, resulting in formation of the contacts 142 and 144.

Figure 10:
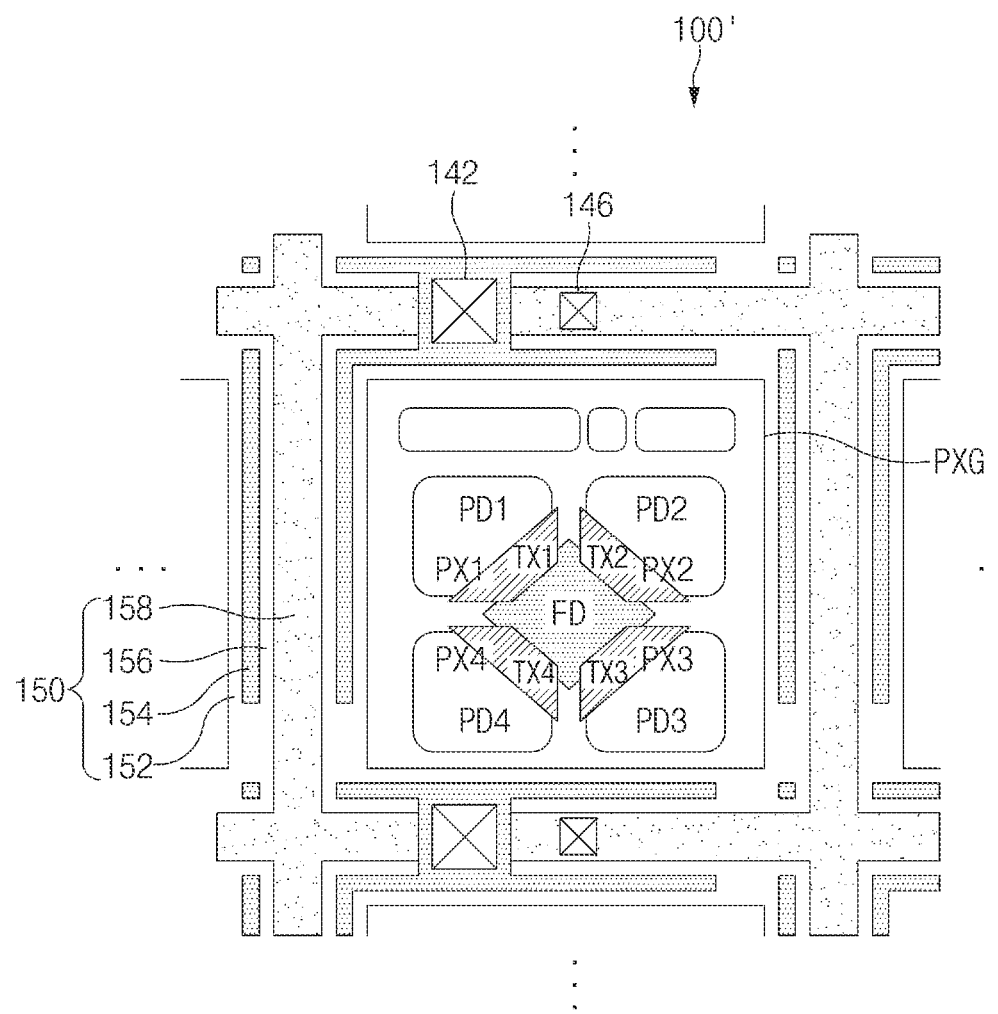
FIG. 10 is a schematic diagram illustrating an example of a dual conversion gain (DCG) capacitor based on some other implementations of the disclosed technology.

FIG. 10 is a diagram illustrating an example of a dual conversion gain (DCG) capacitor based on some other implementations of the disclosed technology.

Referring to FIG. 10, the dual conversion gain (DCG) capacitor can also be applied to a structure in which the unit pixels share only one floating diffusion region FD.

For example, although the pixel array 100 shown in FIG. 1 includes the plurality of unit pixels PXs consecutively arranged in the X-axis direction and the Y-axis direction, a pixel array 100' shown in FIG. 10 can also include a plurality of unit pixel groups PXGs consecutively arranged in the X-axis direction and the Y-axis direction based on another embodiment of the disclosed technology. In this case, each unit pixel group PXG may include a structure in which the unit pixels PX1-PX4 share only one floating diffusion region FD.

For example, each unit pixel group PXG may include four unit pixels PX1-PX4 arranged to surround only one floating diffusion region FD. The unit pixels PX1, PX2, PX3, and PX4 may respectively include photoelectric conversion elements PD1, PD2, PD3, and PD4, and may respectively include transfer transistors TX1, TX2, TX3, and TX4. Each of the photoelectric conversion elements PD1-PD4 may generate photocharges through photoelectric conversion of incident light. The transfer transistors TX1-TX4 may transfer photocharges generated by the corresponding photoelectric conversion elements PD1-PD4 to the floating diffusion region FD based on a transmission signal.

The unit pixel groups PXGs may be physically isolated from adjacent unit pixel groups by a device isolation region 150. The device isolation region 150 may include a trench isolation structure, and may also include a dual conversion gain (DCG) capacitor formed in the trench. The device isolation region 150 may include an insulation layer 152, a first conductive layer 154, an insulation layer 156, and a second conductive layer 158. In this case, the insulation layer 152, the first conductive layer 154, the insulation layer 156, and the second conductive layer 158 shown in FIG. 10 may be substantially identical in structure to the insulation layer 132, the first conductive layer 134, the insulation layer 136, and the second conductive layer 138 shown in FIGS. 2, 3A and 3B.

Unlike the device isolation region 130 described in the above-mentioned implementations, the device isolation region 150 shown in FIG. 10 may be configured to isolate the adjacent unit pixel groups PXGs from each other. However, the device isolation region 150 shown in FIG. 10 may be substantially identical in internal structure to the device isolation region 130.

The first conductive layer 154 may be coupled to the contact 142. For example, the contact 142 may be coupled to a DCG voltage node VDCG through conductive layers or metal lines. The second conductive layer 158 may be coupled to the contact 146. For example, the contact 146 may be coupled to a ground node GND. Although FIG. 10 illustrates that the contacts 146 are formed only at upper and lower sides of the unit pixel group PXG, the arrangement and number of the contacts 146 can vary depending on various embodiments of the disclosed technology.

As is apparent from the above description, the image sensing device based on some implementations of the disclosed technology can increase capacitance of a floating diffusion region FD by forming a metal-insulator-metal multilayer in the device isolation region, while less affecting the pixel region.

Although a number of illustrative embodiments have been described, it should be understood that variations and modifications of the disclosed embodiments and other embodiments can be devised based on what is described and/or illustrated in this patent document.

What is claimed is:

1. An image sensing device comprising:
a substrate;
a plurality of unit image sensing pixels supported by the substrate and structured to respond to incident light to generate an electrical signal corresponding to the incident light; and
device isolation regions supported by the substrate and arranged between adjacent unit image sensing pixels to isolate the plurality of unit image sensing pixels from each other,
wherein the device isolation regions include:
first and second device isolation regions disposed between adjacent unit image sensing pixels in a first direction; and
third and fourth device isolation regions disposed between adjacent unit image sensing pixels in a second direction perpendicular to the first direction,
wherein each of the first, second, third and fourth device isolation regions includes:
a first conductive layer;
a second conductive layer spaced apart from the first conductive layer; and
a first insulation layer disposed between the first conductive layer and the second conductive layer,
wherein the first conductive layer of the third device isolation region is in contact with a first contact and the first conductive layer of the fourth device isolation region is in contact with another first contact.

2. The image sensing device according to claim 1, wherein each of the first, second, third and fourth device isolation regions includes a multilayer structure supported by the substrate and including the first conductive layer, the first insulation layer, and the second conductive layer extending vertically, and
wherein the multilayer structure further includes a second insulation layer disposed between the first conductive layer and the adjacent unit image sensing pixels.

3. The image sensing device according to claim 1, wherein the first conductive layers of the first and second device isolation regions are isolated from each other.

4. The image sensing device according to claim 3, wherein the first device isolation region includes a horizontal multilayer structure including the first conductive layer, the first insulation layer, and the second conductive layer extending horizontally, and
wherein the horizontal multilayer structure includes a first horizontal multilayer structure and a second horizontal multilayer structure spaced apart from the first horizontal multilayer structure by a recessed region formed between the first horizontal multilayer structure and the second horizontal multilayer structure.

5. The image sensing device according to claim 1 wherein each of the first contact and the other first contact is coupled to a dual conversion gain (DCG) voltage node configured to apply a voltage that is higher than a ground voltage.

6. The image sensing device according to claim 1, wherein the second conductive layers of the third and fourth device isolation regions include a plurality of portions spaced apart from each other at a region where the first contact and the other first contact are formed.

7. The image sensing device according to claim 1, wherein at least one of the second conductive layers of the first to fourth device isolation regions is coupled to a second contact.

8. The image sensing device according to claim 3, wherein the first conductive layers of the third and fourth device isolation regions are isolated from each other.

9. The image sensing device according to claim 3, wherein the first conductive layers of the first and third device isolation regions are electrically coupled to each other.

10. The image sensing device according to claim 3, wherein the first conductive layers of the second and fourth device isolation regions are isolated from each other.

11. The image sensing device according to claim 1, the first conductive layer of the third device isolation region is electrically coupled to the first conductive layer of the first device isolation region and is isolated from the first conductive layers of the second and fourth device isolation regions.

* * * * *